United States Patent
Vitale

(10) Patent No.: US 7,494,882 B2
(45) Date of Patent: Feb. 24, 2009

(54) MANUFACTURING A SEMICONDUCTIVE DEVICE USING A CONTROLLED ATOMIC LAYER REMOVAL PROCESS

(75) Inventor: Steven Arthur Vitale, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 293 days.

(21) Appl. No.: 11/373,662

(22) Filed: Mar. 10, 2006

(65) Prior Publication Data

US 2007/0212864 A1    Sep. 13, 2007

(51) Int. Cl.
*H01L 21/336* (2006.01)
(52) U.S. Cl. .............................. 438/286; 257/E21.158; 257/E21.58
(58) Field of Classification Search .......... 438/286.304, 438/305, 531, 596; 257/E21.242, E21.158, 257/E21.58
See application file for complete search history.

(56) References Cited

U.S. PATENT DOCUMENTS 5,741,736 A * 4/1998 Orlowski et al. ............ 438/286
6,146,930 A * 11/2000 Kobayashi et al. .......... 438/154

* cited by examiner

*Primary Examiner*—Walter L Lindsay, Jr.
(74) *Attorney, Agent, or Firm*—Frederick J. Telecky, Jr.; Wade J. Brady, III

(57) ABSTRACT

A method for manufacturing a semiconductive device comprising forming a mask for a semiconductive device structure over a layer of a semiconductor substrate and partially etching the layer to form lateral and vertical surfaces. Thicknesses of one to several atomic diameters of atoms that comprise said layer are removed from the lateral surfaces and the vertical surfaces that are located under the mask to form a target dimension of a semiconductive device structure.

22 Claims, 5 Drawing Sheets

MANUFACTURING A SEMICONDUCTIVE DEVICE USING A CONTROLLED ATOMIC LAYER REMOVAL PROCESS

TECHNICAL FIELD

The invention is directed, in general, to the semiconductive devices for integrated circuits and their method of manufacture.

BACKGROUND

As semiconductive device dimensions shrink to accommodate higher packing densities, it becomes increasingly difficult to manufacture device components with small dimensions. The photolithographic patterning of photoresists has been used to define features in semiconductor devices for several generations of technology nodes. At decreasingly smaller technology nodes, however, a patterned photoresist becomes more prone to deformation or breakage. Consequently, it is difficult to construct small device structures, such as gate structures, in integrated circuits with sufficient reliably to provide an operative circuit.

Accordingly, what is needed is a method for manufacturing semiconductor device components that addresses the drawbacks of the prior art methods and devices.

SUMMARY

The invention provides a method for manufacturing a semiconductive device. The method comprises forming a mask for a semiconductive device structure over a layer of a semiconductor substrate and partially etching the layer to form lateral and vertical surfaces. The method also comprises removing thicknesses of one to several atomic diameters of atoms that comprise the layer from the lateral surfaces and the vertical surfaces that are located under the mask to form a target dimension of a semiconductive device structures each of the thicknesses being equal to about one to several atomic diameters of atoms that comprise said layer.

Another embodiment comprises a method of manufacturing an integrated circuit. The method comprises forming a semiconductive device as described above, and forming interconnects to interconnect the semiconductive device to form an operative integrated circuit.

DETAILED DESCRIPTION

The invention benefits from the recognition that semiconductor device components can be formed by a discontinuous atomic layer removal process. By incrementally removing one to a few atomic layers in each of a plurality of removal steps using free radicals, it is possible to precisely control the formation of device structures having very small dimensions. This is in contrast to conventional etch methods that are continuous processes and that use both free radicals and ions to remove material layers as rapidly as possible. The atomic layer removal process of the invention allows the surfaces of device components to be shaped to sizes that are smaller than what can be reliably attained using conventional photoresists and photolithographic methods.

Figure 1:
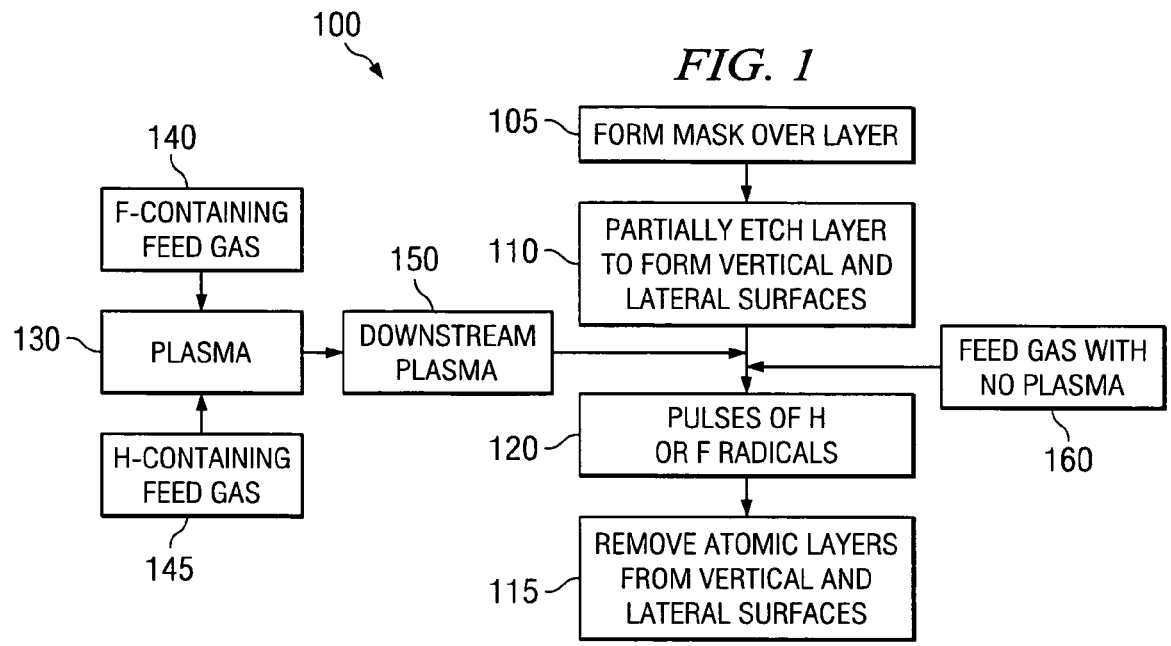
FIG. 1 presents a flow diagram of an example method of manufacturing a semiconductive device of the invention.

One embodiment is a method of manufacturing a semiconductive device. FIG. 1 presents a flow diagram of an example method 100 of manufacturing a semiconductive device. The method comprises in step 105, of forming a mask for a semiconductor device structure over a layer of a semiconductor substrate. The semiconductor substrate can comprise any conventional material used in semiconductive device fabrication. For example, the substrate can comprise a silicon wafer and could include oxide, silicon other material layers thereon. The mask can be formed using conventional photolithographic methods, and patterned from one or more layers that comprise e.g., conventional photoresist or hardmask materials. The patterned mask defines the location of functional or sacrificial structures to be constructed in the layer. The layer, in turn, can comprise functional or sacrificial material formed on the semiconductor substrate.

In step 110, the layer is partially etched to form lateral and vertical surfaces. For example, a conventional anisotropic plasma etch can be performed to remove portions, but not all, of the layer that is not directly below the mask. The resulting partially etched layer therefore has newly formed vertical surfaces under the mask and retains lateral surfaces that are not under the mask.

The method further comprises a step 115 of removing thicknesses of one to several atomic diameters of atoms that comprise said layer (hereinafter referred to as atomic layers) from the lateral surfaces, as well as the vertical surfaces that are located under the mask, to form a target dimension of the semiconductive device structure. In some cases, the target dimension is a critical dimension of a semiconductor device structure. In some cases, for example, the target dimension can be the critical dimension of a transistor gate length. In preferred embodiments, the removal is isotropic, meaning that substantially the same number of atomic layers is removed from the vertical surfaces as from the lateral surfaces per individual removal step.

In preferred embodiments, removing the atomic layers comprises briefly exposing the vertical and lateral surfaces to pulses of fluorine or hydrogen radicals, in step 120. While not limiting the scope of the invention by theory, it believed that short pulses of exposure to one or both of these radicals allow atoms of the layer to chemically react with the radicals and subsequently to be removed in a controlled fashion. By adjusting the durations of individual pulses (e.g., about 1 sec or less, and in some cases, about 1 to about 100 ms) , and by separating the pulses by delay times (e.g., about 1 to about 10 s), it is possible exert very precise control over the amount of material removed from the vertical and lateral surfaces.

The removal process can be configured to cause one to several atomic layers to be removed per pulse. An atomic layer is equal to the diameter of the atoms that comprise the layer, or average diameter, when the layer comprise substantial amounts of several different types of atoms. For example, in the case where the layer comprises silicon, e.g., polysilicon, one atomic layer equals the atomic diameter of silicon (e.g., about 2 Angstroms).

In some cases, the fluorine radicals or the hydrogen radicals are generated in a plasma, in step 130. The plasma can be generated by, e.g., capacitively coupled, inductively coupled, or microwave plasma sources. The free radicals are generated from one or more feed gases. The fluorine radicals can be generated by introducing fluorine containing feed gases into the plasma, in step 140, such as $F_2$, $NF_3$, or $SF_6$ gas, or combinations thereof. Similarly, the hydrogen radicals can be generated by introducing hydrogen-containing feed gases into the plasma, in step 145, such as $H_2$ or $CH_4$ gas, or combinations thereof. In some instances, both fluorine and hydrogen radicals are generated and the vertical and lateral surfaces are exposed to both types of free radicals.

In some preferred embodiments, the fluorine radicals or the hydrogen radicals are generated, in step 150, in a downstream plasma source. The term, downstream, refers to a plasma source that is sufficiently physically removed from the semiconductor substrate that the substrate does not get exposed to plasma itself or to ions generated by introducing the feed gas into the plasma. Preferably, the vertical and lateral surfaces of the layer are exposed only to the radicals produced by the plasma. Eliminating direct exposure to the plasma or ions generated in the plasma is advantageous because exposure to energetic ion flux would increase the vertical etch rate of the lateral surfaces of the layer, without significant increase in its vertical surfaces. This is in contrast to many conventional anisotropic plasma etch processes, where the vertical etching of surfaces are facilitated by exposure to both radicals and ions.

In other cases, the fluorine radicals are generated in the absence of a plasma source, in step 160. For example, the vertical and lateral surfaces can be exposed to xenon difluoride ($XeF_2$) feed gas, which spontaneously produces fluorine radicals without being exposed to plasma.

To further illustrate aspects of the method, FIGS. 2-8 presents cross-sectional views of an example semiconductive device 200 at different stages of manufacture. Any of the steps presented in the context of FIG. 1 can be used to form the semiconductive device 200.

In this example, a polysilicon layer is partially etched, as per step 110, and then subject to the atomic layer removal, as per step 115, wherein a transistor gate comprises the semiconductive device structure and the target dimension is a gate length of the transistor gate. In other embodiments, however, other types of layers could be treated in a similar fashion to produce other types of semiconductive device structures. For instance, the layer could be the semiconductor substrate itself. For example, the semiconductor substrate could be treated according to the method to make a semiconductive device structures comprising a transistor channel structure for a multi-gate transistor, such as a FIN field effect transistor.

Figure 2:
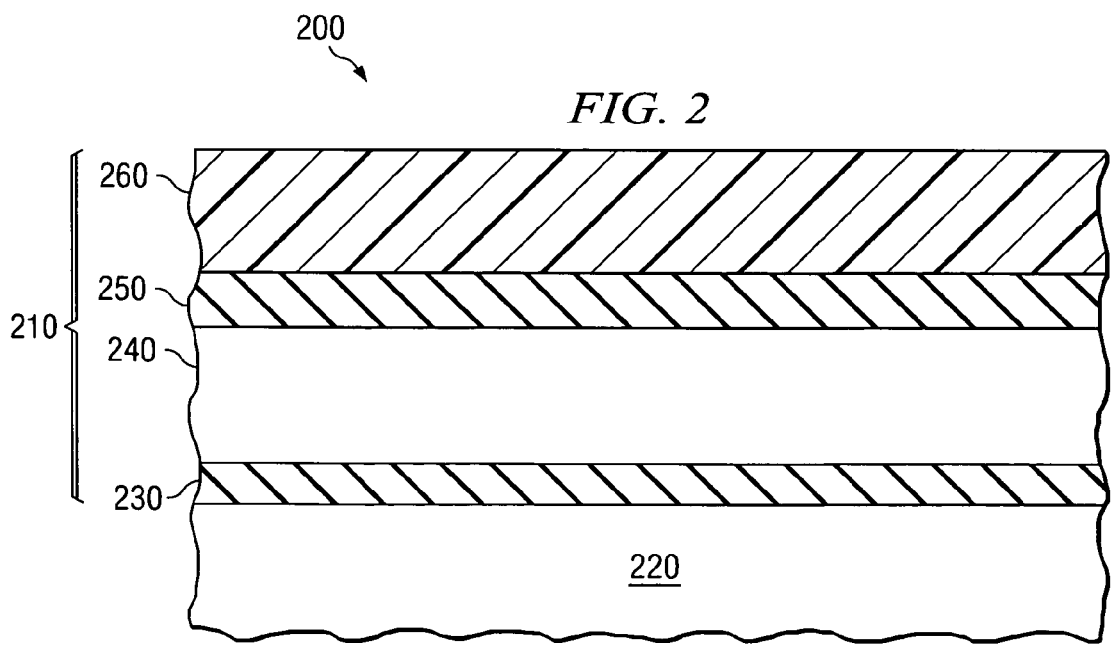
FIGS. 2 to 7 illustrate cross-section views of selected steps of an example implementation of a method of fabricating a semiconductive device of the invention.

FIG. 2 shows the semiconductive device 200, after depositing a stack of layers 210 on the semiconductor substrate 220, e.g., a silicon wafer. The stack of layers 210 can be formed by physical vapor deposition (PVD) or chemical vapor deposition (CVD) or other conventional techniques. The layers can be composed of functional materials that will be retained in the final device, or sacrificial material that is used in the formation of device structures, but is not retained in the final device.

As an example, the stack of layers 210 can comprise an oxide layer 230 (e.g., silicon oxide), a polysilicon layer 240, a hardmask layer 250 and a resist layer 260. The hardmask layer 250 can comprise any conventional oxide or nitride, such as silicon nitride, used in the definition of semiconductive device structures. Similarly, the resist layer 260 can comprise any conventional negative or positive light sensitive organic polymer that is commonly used to define semiconductive device structures. In some preferred embodiments, for example, the resist layer 260 comprises an ultraviolet photoresist material, such as a 193 nm or 157 nm resist.

Figure 3:
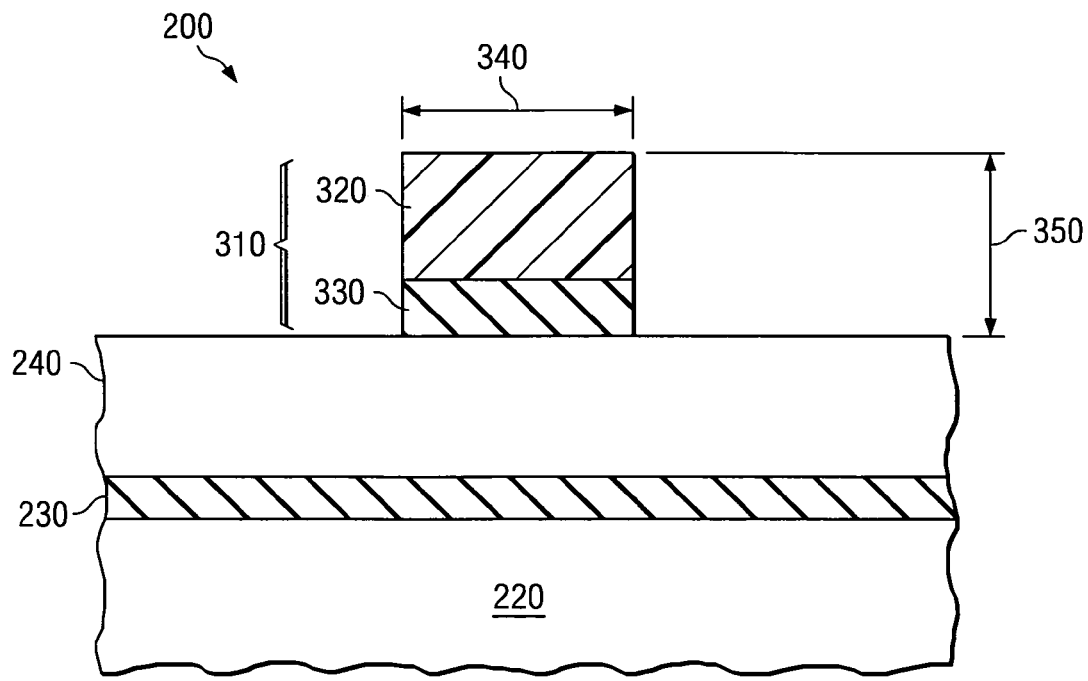

FIG. 3 presents the device 200 after forming a mask 310 for a semiconductive device structure over a layer (e.g., the polysilicon layer 240) of the substrate 220, in accordance with step 105 (FIG. 1). As illustrated in FIG. 3, the mask 310 can comprise a patterned resist 320 and a patterned hardmask 330. The mask 310 can be formed using conventional photolithographic methods to pattern the resist 320, e.g., by exposure to ultraviolet light to harden portions of the resist layer 260. Similarly, the patterned hardmask 330 can be formed by applying conventional etch process to remove portions of the hardmask layer 250 shown in FIG. 2 that are not covered by the patterned resist 320. For example, when the hardmask layer 250 (FIG. 2) comprises silicon nitride, a hardmask etch process can include etching in a conventional inductively coupled plasma etcher, using fluorocarbon gases such as $CHF_3$ or $CH_2F_2$, with source powers in the range of about 300 to about 800 Watts and chamber pressure of about 4 to about 50 milliTorr.

Forming the mask 310 can further include laterally trimming the patterned resist 320 or the patterned hardmask 330 to further reduce a lateral dimension 340 of the mask 310. Trimming the patterned resist 320, for example, can comprise an isotropic continuous low power plasma ash comprising hydrogen Bromide (HBr) and oxygen ($O_2$) feed gases at low pressure (e.g., about 4 to about 10 milliTorr). Trimming the patterned hardmask 330 can comprise, e.g., a continuous, isotropic, fluorine-based ion-enhanced chemical etch.

In some embodiments, the lateral dimension 340 of the mask 310 ranges from about 50 nanometers to about 40 nanometers. This range reflects a compromise between obtaining as small a lateral dimension as possible, and mitigating the potential deformation or breakage of the patterned resist 320 or hardmask 330. In some embodiments, it is preferable for the mask 310 (e.g., the patterned resist 320, the patterned hardmask 330, or both) to have a vertical:lateral aspect ratio of 3:1 or less. For example, if the lateral dimension 340 of the patterned resist 320 equals about 40 nanometers then the vertical dimension 350 is about 120 nanometers or less. A low aspect ratio is preferred because this helps avoid the deformation or breakage of the patterned resist 320 or hardmask 330, that is likely to occur with taller or narrower structures.

Figure 4:
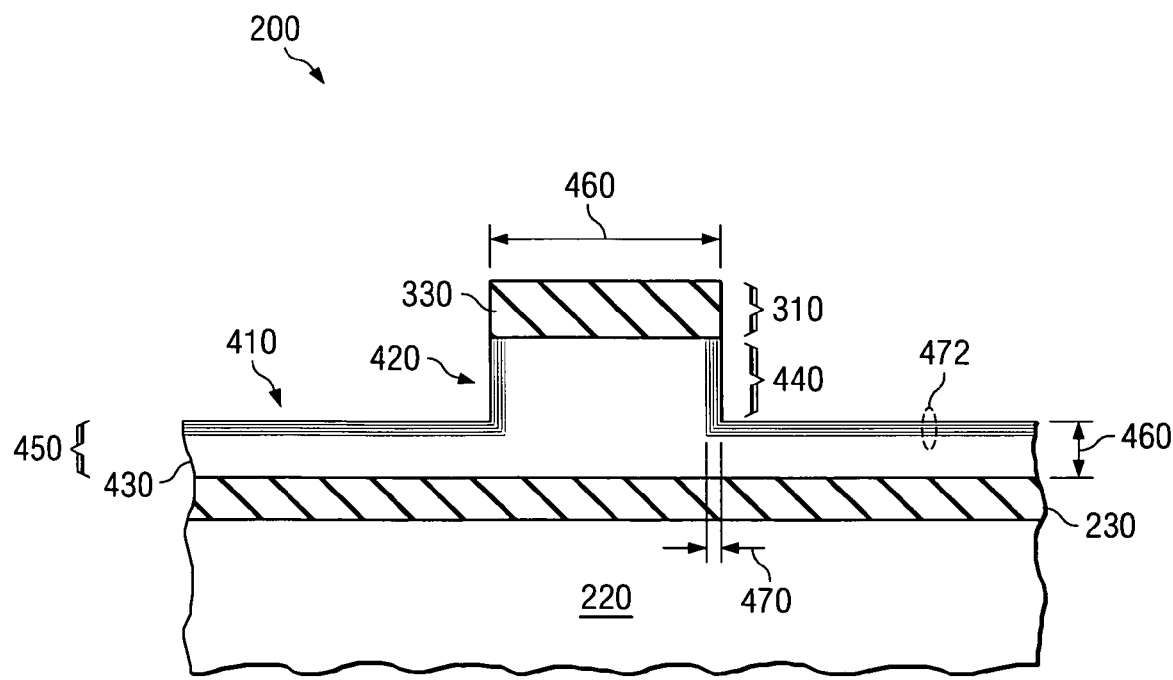

FIG. 4 illustrates the device 200 after partially etching the layer to form lateral surfaces 410 and vertical surfaces 420, in accordance with step 110 (FIG. 1). The device 200 is shown after also stripping away the patterned resist 320 (FIG. 3) with e.g., an oxygen-based plasma resist strip process. In other embodiments, however, patterned resist 320 can be retained throughout step 110 or step 115 (FIG. 1).

Partial etching can comprise removing portions of the layer that are not covered by the mask 310. For instance, a polysilicon layer 240 (FIG. 2) can be partially etched using an aniostropic etch comprising e.g., an inductive plasma with HBr and chlorine ($Cl_2$) feed gases, a pressure of about 5 to 10 mTorr, a plasma source power of about 500 Watts, and a voltage bias of about 100 Volts.

As further illustrated in FIG. 4, the partially etched structure 430 has a raised structure 440 and a base layer 450. The mask 310 is over the raised structure 440. The lateral dimension 460 of the raised structure 440 is substantially the same as the lateral dimension 340 (FIG. 3) of the mask 310 (e.g., about 50 to 40 nanometers in some embodiments). The raised structure 440 has the vertical surfaces 420 and the base layer 450 has the lateral surface 410.

Preferably, the base layer 450 has a thickness 460 that is greater than a thickness 470 of the atomic layers 472 to be removed from the vertical surfaces 420 and the lateral surfaces 410 in step 115 (FIG. 1). This helps to ensure that the underlying layers (e.g., the substrate 220 or oxide layer 230) are not damaged by the removal process. For example, if the lateral surface 460 of the raised structure 440 is to be reduced from about 50 nanometers to about 30 nanometers, then each of the vertical surfaces 420 will be reduced by a thickness 470 of about 10 nanometers. In this case, the thickness 460 of the base layer 450 is preferably greater than about 10 nanometers.

Figure 5:
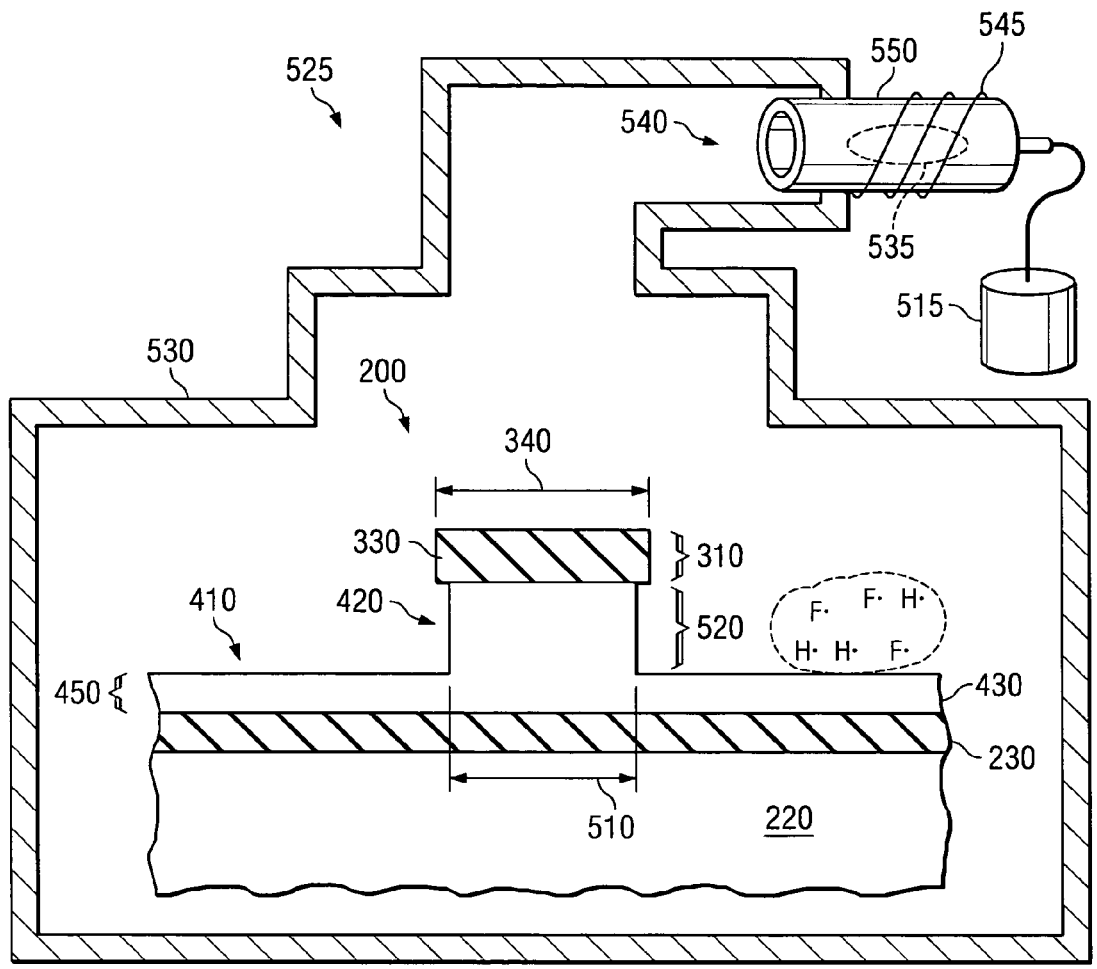

FIG. 5. shows the device 200 after removing the atomic layers 472 of a desired thickness 470 (FIG. 4) from the lateral surfaces 410 and the vertical surfaces 420 of the raised structure 440 (FIG. 4) that are located under the mask 310. The atomic layer removal forms a target dimension 510 of the semiconductive device structure 520, in accordance with step 115 (FIG. 1). For the example illustrated in FIG. 5, the thickness 340 of the mask 310 is substantially unchanged by the atomic layer removal process, and hence it continues to cover the semiconductive device structure 520.

The atomic layer removal process can comprise brief exposures of the vertical 420 and lateral surfaces 410 to hydrogen (H.) or fluorine (F.) radicals, in accordance with step 120 (FIG. 1). The radicals can be produced from the appropriate feed gases 515, as per steps 140 or 145 (FIG. 1).

For instance, when the partially etched structure 430 comprises polysilicon, the exposure can comprise feeding gases 515 comprising $F_2$, $SF_6$, $H_2$ or $NF_3$, or combinations thereof, into an etching tool 525 (e.g., a plasma etching tool) at a feed rate of about 50 to about 200 sccm, pressure of about 4 to about milliTorr, and temperature of about 25 to about 65° C. In some cases, the source power to the tool 525 is pulsed for about 10 to about 50 ms, followed by a delay of approximately 1 second. Decomposition of the feed gases 515 during the 10 to 50 ms plasma time will produce short 10 to 50 ms pulses of reactive F or H radicals (F' or H', respectively). For instance, to remove an about 5 nanometer thickness 470 from the vertical surfaces 420 in about 30 seconds, approximately 25 of such pulses can be applied, each pulse comprising feed gases 515 being delivered into the etch chamber 530 of the tool 525 continuously, while the source power to create the plasma is pulsed for about 10 to about 50 ms intervals, followed by a delay time of about 1 s. In some preferred embodiments, the ratio of the duration of the plasma pulse to delay time between pulses is about 1:100 to 1:200.

Any conventional etching tool 525 can be used to accomplish atomic layer removal, so long as the tool 525 can be configured to delivered pulses of radicals to the surfaces 410, 420 in a controlled and repetitive fashion. In some embodiments, the radicals are generated by introducing the feed gases 515 into a plasma 535. In such instances the etch tool 525 comprises a plasma source 540. For example, the etch tool 525 can comprise an inductive radiofrequency plasma source (e.g., a Centura® DPS® system configured with silicon etch DPS II chamber, from Applied Materials, Inc., Santa Clara, Calif.) or a transformer coupled plasma source (e.g., a 2300 Versys® Kiyo™ silicon etch system, from Lam Research, Corp., Freemont, Calif.).

In some cases, as per step 150 (FIG. 1), and as illustrated in FIG. 5, the plasma source 540 is a downstream plasma source (e.g., a Microwave Strip, from Lam Research, Corp., Freemont, Calif.). The downstream plasma source 540 can be configured so that ions generated by introducing the feed gases 515 into the plasma 535 do not contact the lateral and vertical surfaces 410, 420. For example, the plasma source 540 can be located remotely from the semiconductor substrate 220.

In some preferred embodiments the plasma source 540 comprises a dielectric material that with a low surface radical recombination coefficient, which enables a high flux of reactive radicals. For example, in some cases fluorine radicals are formed in a plasma 535 that is generated using a radio frequency copper coil 545 wrapped around an alumina ceramic tube 550. The generation of radicals with long lifetimes is especially beneficial when using a downstream plasma source 540, because the radicals have to diffuse for a period (e.g., about 100 ms) before reaching the surfaces 410, 420.

In other cases, as discussed in the context of step 160 (FIG. 1), the radicals can be produced with no plasma present. For example, one of the above mentioned etch tool 525 could be used with no bias power applied to generate a plasma. When e.g., $XeF_2$ is introduced into the chamber 530, upon contacting silicon surfaces 410, 420, the $XeF_2$ molecules spontaneously decompose to F. and Xe. In some preferred embodiments, the $XeF_2$ feed gas is introduced at a feed rate of about 10 to about 50 sccm into the etch chamber 530 adjusted to a pressure of about 1 to about 10 mTorr and temperature of about 20 to about 65° C. The $XeF_2$ feed gas can be introduced for brief intervals and with delay times similar to that discussed above for the processes where radicals are generated by plasma.

Figure 6:
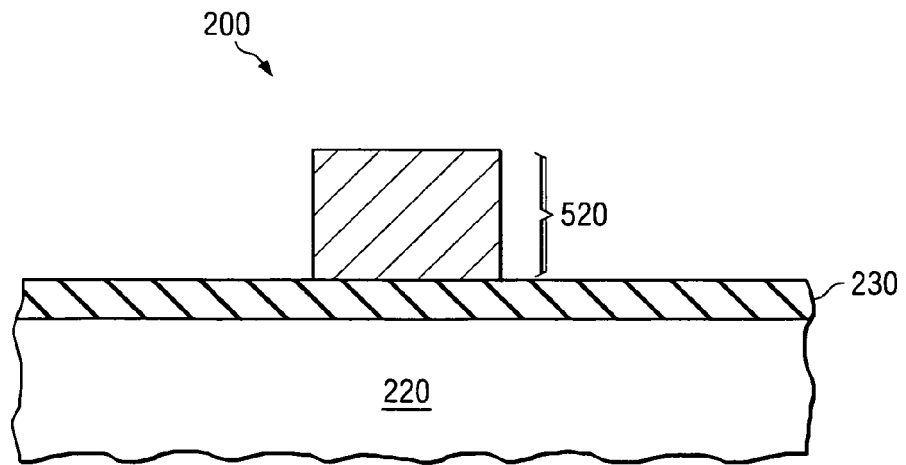

FIG. 6 illustrates the device 200 after removing remaining portions of the base layer 450 that are not covered by the mask 310 (FIG. 5). For example, an anisotropic etch analogous to that discussed in the context of step 110 (FIG. 1) or FIG. 4 can be used, with the oxide layer 230 layer serving as an etch stop. In some cases, the base layer 450 has to be removed to make the semiconductive device structure 520 a functional device component, such as a component (e.g., the gate electrode) of a gate transistor. Thereafter, the mask 310 is removed, e.g., by stripping away the patterned mask 330 with conventional stripping agents. In other cases, however, the base layer 450 or the mask 310 can be retained.

Figure 7:
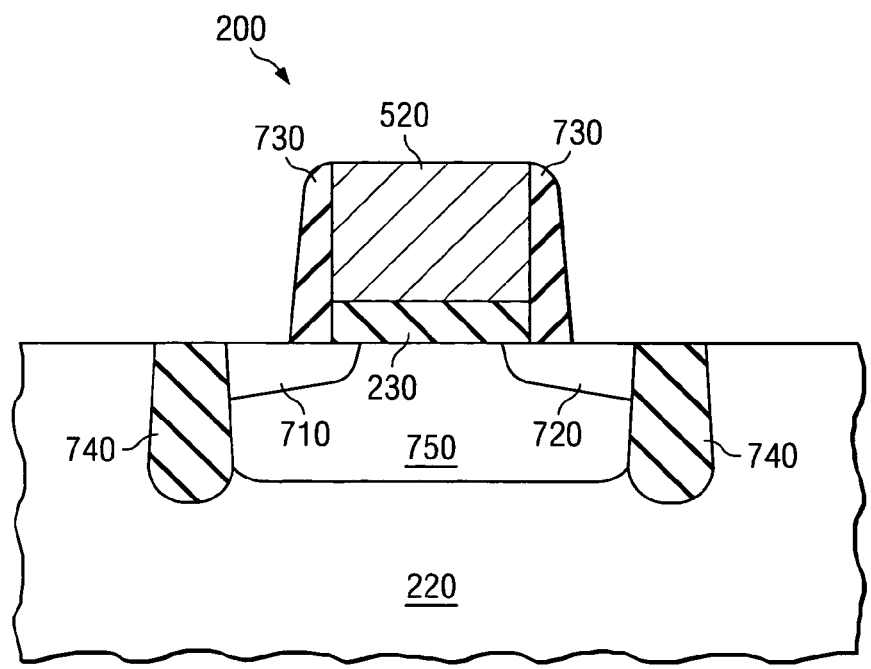

FIG. 7 illustrates the semiconductive device 200 after performing additional conventional fabrication steps to construct an active device. One skilled in the art would be familiar with such fabrication steps, which could include e.g., the construction of source and drain structures 710, 720, sidewalls 730, shallow trench isolation structures 740, and doped well 750. In some preferred embodiments the semiconductive device 200 comprises a metal oxide semiconductor (MOS) transistor, such as a p-type (pMOS) or n-type (nMOS) transistor. In other preferred embodiment the semiconductive device 200 comprises a complementary metal oxide semiconductor (CMOS) transistor.

Figure 8:
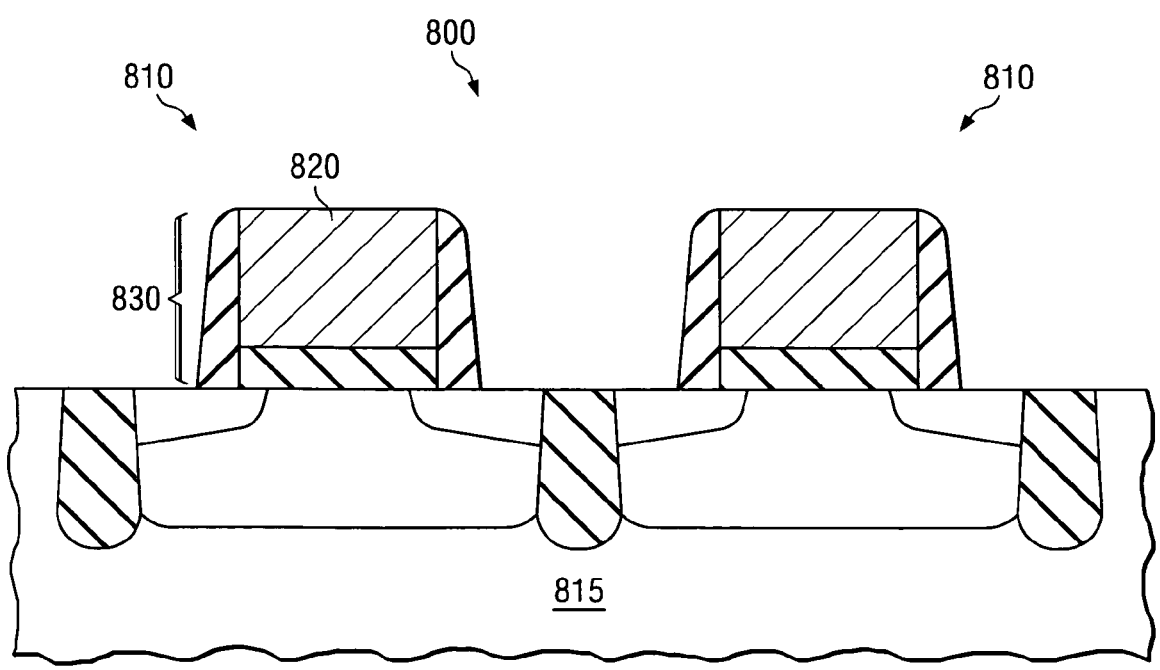
FIGS. 8 and 9 show cross-sectional views of an example method of manufacturing an integrated circuit of the invention.
Figure 9:
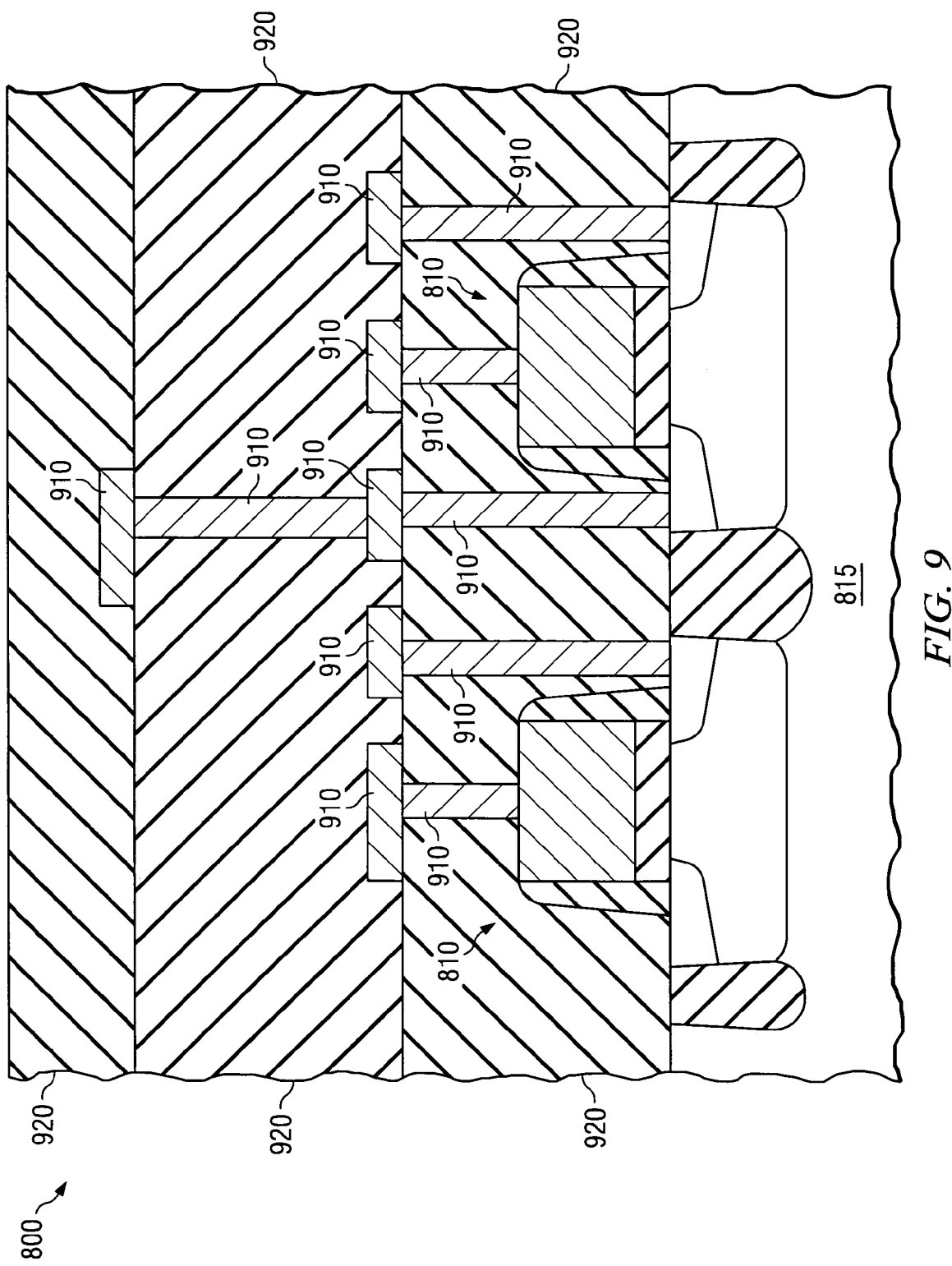

Another embodiment of the invention is a method of manufacturing an integrated circuit. FIGS. 8 and 9 show cross-sectional views of an example method of manufacturing an integrated circuit 800 of the invention. FIG. 8. presents the integrated circuit 800 after forming one or more semiconductive device 810 on a semiconductor substrate 815. The device 810 can be manufactured according to any of the example embodiments discussed above in the context of FIGS. 1-7. For instance, a semiconductive device structure 820 that is a component of a gate transistor 830 can be formed by partially etching a polysilicon layer to form lateral and vertical surfaces and then removing atomic layers from these surfaces, as discussed above.

FIG. 9 shows the integrated circuit 800 after forming interconnects 910 in or on one or more insulating layer 920 located over the semiconductive device 810. One of ordinary skill would understand that the method can be extended to form interconnects 910 and would also understand how to connect those interconnects 910 with the semiconductive device 810 and other active devices to form an operative integrated circuit 800.

The invention claimed is:

1. A method for manufacturing a semiconductive device, comprising:
   forming a mask for a semiconductive device structure over a layer of a semiconductor substrate;
   partially etching said layer to form lateral and vertical surfaces; and
   removing thicknesses of one to seven atomic diameters of atoms that comprise said layer from said lateral surfaces and said vertical surfaces that are located under said mask to form a target dimension of a semiconductive device structure, each of said thicknesses being equal to about one to seven atomic diameters of atoms that comprise said layer.

2. The method of claim 1, wherein said layer comprises polysilicon.

3. The method of claim 1, wherein said semiconductive device structure is a transistor gate and said target dimension is a gate length.

4. A method for manufacturing a semiconductive device, comprising:
   forming a mask for a semiconductive device structure over a layer of a semiconductor substrate;
   partially etching said layer to form lateral and vertical surfaces; and
   removing thicknesses of one to several atomic diameters of atoms that comprise said layer from said lateral surfaces and said vertical surfaces that are located under said mask to form a target dimension of a semiconductive device structure, each of said thicknesses being equal to about one to several atomic diameters of atoms that comprise said layer, wherein said target dimension is about 40 nanometers or less.

5. The method of claim 1, wherein said partial etching comprises removing portions of said layer that are not covered by said mask.

6. The method of claim 1, wherein said mask comprises a patterned resist and a patterned hardmask.

7. The method of claim 1, wherein said removing comprises exposing said vertical and lateral surfaces to pulses of fluorine or hydrogen radicals.

8. A method for manufacturing a semiconductive device, comprising:
   forming a mask for a semiconductive device structure over a layer of a semiconductor substrate;
   partially etching said layer to form lateral and vertical surfaces; and
   removing thicknesses of one to several atomic diameters of atoms that comprise said layer from said lateral surfaces and said vertical surfaces that are located under said mask to form a target dimension of a semiconductive device structure, each of said thicknesses being equal to about one to several atomic diameters of atoms that comprise said layer, wherein
   said removing comprises exposing said vertical and lateral surfaces to pulses of fluorine or hydrogen radicals, and
   individual ones of said pulses are about 1 second or less.

9. The method of claim 7, wherein said fluorine or said hydrogen radicals are generated in a plasma using one or more of $F_2$, $NF_3$, $SF_6$, $H_2$ or $CH_4$ feed gases.

10. The method of claim 7, wherein said plasma is a downstream plasma source.

11. The method of claim 7, wherein said fluorine radicals are generated in the absence of plasma from $XeF_2$ feed gas.

12. A method of manufacturing an integrated circuit comprising:
    forming a semiconductive device comprising:
       forming a mask for a semiconductive device structure over a layer of a semiconductor substrate;
       partially etching said layer to form lateral and vertical surfaces; and
       removing atomic layers from said lateral surfaces and said vertical surfaces that are located under said mask to form a target dimension of a semiconductive device structure, each of said atomic layers being equal to about one to seven atomic diameters of atoms that comprise said layer; and
    forming interconnects to interconnect said semiconductive device to form an operative integrated circuit.

13. The method of claim 12, wherein said layer comprises polysilicon and said semiconductive device structure is a transistor gate.

14. The method of claim 12, wherein said semiconductive device is a MOS transistor.

15. The method of claim 12, wherein said target dimension is a transistor gate length.

16. A method of manufacturing an integrated circuit comprising:
    forming a semiconductive device comprising:
       forming a mask for a semiconductive device structure over a layer of a semiconductor substrate;
       partially etching said layer to form lateral and vertical surfaces; and
       removing atomic layers from said lateral surfaces and said vertical surfaces that are located under said mask to form a target dimension of a semiconductive device structure, each of said atomic layers being equal to about one to several atomic diameters of atoms that comprise said layer; and
    forming interconnects to interconnect said semiconductive device to form an integrated circuit, wherein said target dimension is about 40 nanometers or less.

17. The method of claim 12, wherein said removing comprises exposing said vertical and lateral surfaces to bursts of fluorine or hydrogen radicals.

18. A method of manufacturing an integrated circuit comprising:
    forming a semiconductive device comprising:
       forming a mask for a semiconductive device structure over a layer of a semiconductor substrate;
       partially etching said layer to form lateral and vertical surfaces; and
       removing atomic layers from said lateral surfaces and said vertical surfaces that are located under said mask to form a target dimension of a semiconductive device structure, wherein said removing comprises exposing said vertical and lateral surfaces to bursts of fluorine or hydrogen radicals, and individual ones of said bursts are less than about 1 second.

19. The method of claim 17, wherein said fluorine or said hydrogen radicals are generated in a plasma using one or more of $F_2$, $NF_3$, $SF_6$, $H_2$ or $CH_4$ gases.

20. The method of claim 17, wherein said fluorine radicals are generated in the absence of plasma from $XeF_2$ gas.

21. The method of claim 1, wherein said removing is accomplished without substantially exposing said lateral surfaces and said vertical surfaces to plasma-generated ions.

22. The method of claim 12, wherein said removing is accomplished without substantially exposing said lateral surfaces and said vertical surfaces to plasma-generated ions.

* * * * *